United States Patent [19]

Hilpert

[11] Patent Number: 5,706,668
[45] Date of Patent: Jan. 13, 1998

[54] COMPUTER HOUSING WITH COOLING MEANS

[76] Inventor: Bernhard Hilpert, Balinger Strasse 3, D-71636 Ludwigsburg, Germany

[21] Appl. No.: 437,315

[22] Filed: May 9, 1995

[30] Foreign Application Priority Data

Dec. 21, 1994 [DE] Germany .................. 44 45 818.5

[51] Int. Cl.⁶ ........................................... F25D 23/12
[52] U.S. Cl. .................. 62/259.2; 62/440; 361/690; 361/700; 361/695
[58] Field of Search ................... 62/440, 259.2; 165/80.2, 80.3, 80.4, 104.33; 361/689, 690, 694, 695, 696, 699, 700

[56] References Cited

U.S. PATENT DOCUMENTS 2,300,303 10/1942 Morrison .............................. 62/440
4,545,519 10/1985 Rohner ................................ 361/700
4,977,754 12/1990 Upton et al. .......................... 62/440

FOREIGN PATENT DOCUMENTS 2-205397 8/1990 Japan .................................. 361/696

*Primary Examiner*—John M. Sollecito
*Attorney, Agent, or Firm*—Helfgott & Karas, P.C.

[57] ABSTRACT

The housing for sensitive instruments, with an inlet and an outlet for cool air as well as a device for circulating the cool air, is divided into a first chamber and a second chamber, which is hermetically sealed from the first chamber. A cooling unit is disposed in the housing. Separate air streams are circulated in the two chambers, both air streams being sealed hermetically from one another. The first air stream is circulated in a closed cycle and cooled at a first heat exchanger of the cooling unit. The second air stream cools a second heat exchanger of the cooling unit, which is in the second chamber, and flows through the outlet into the surroundings.

8 Claims, 3 Drawing Sheets

COMPUTER HOUSING WITH COOLING MEANS

BACKGROUND OF THE INVENTION

The invention relates to a sensitive apparatus housing such as a computer housing for industrial use with an inlet and an outlet for cooling air and facilities circulating the cooling air within the housing.

Since electronic components of sensitive apparatus such as computers emit heat, it is customary to dissipate this heat by taking in cooling air from the surroundings by means of a fan or other aspirator through an inlet of the housing, circulating it in the housing and discharging it through an outlet back into the surroundings.

Dirt particles, dust, vapors and other materials contained in the air also enter the interior of the sensitive apparatus along with the cooling air taken in from the surroundings. This does not lead to problems in an office environment. However, in industrial environments hostile materials, such as aerosols of acids or salts dissolved in water, oils or dust consisting of electrically charged particles may also be contained in the cooling air. All of these materials can affect the ability of such apparatus to function. The electrical contacts can erode, thin circuit boards may be etched away, short circuits may develop or the housings of chip components may be destroyed, to name just a few of the sources of damage. To solve these problems, the inlet and outlet openings for the cooling air have previously been provided with filter mats, in order to prevent extraneous materials from reaching the interior of the housing. However, these filter mats develop a resistance to the flow of the air, so that stronger fan motors must be used. Such stronger motors in turn emit more heat and, of course, also increase the consumption of energy.

The filter mats, used in prior art arrangements, become dirty relatively quickly in industrial environments. This can lead to blockage of the air flow and makes it necessary to exchange the filter mats relatively frequently. Accordingly, the sensitive apparatus is not maintenance-free. Monitoring equipment has also already been proposed for monitoring the degree of contamination of the filter mats by measuring the flow of air and forcibly switching the apparatus off, when the flow of cooling air has reached a lower limiting value.

If such a monitoring system is missing, failure of the instruments due to overheating can result.

Most electronic components of computers and other sensitive apparatus are able to perform properly within only a limited temperature range. For this reason, it has not previously been possible, despite the cooling described, to use such apparatus in very hot industrial environments, such as those, which occur in foundries, in the vicinity of blast furnaces, etc. The "cooling air", which originates from such surroundings, is already so hot, that it cannot bring about any effective cooling of the components to their permissible temperature range.

SUMMARY OF THE INVENTION

It is therefore an object of the present invention to provide a housing, which enables the sensitive apparatus to be operated satisfactorily even in a rough industrial environment, particularly even when the air is highly contaminated and/or the surrounding temperature is high.

This objective is accomplished by the following distinguishing features: the housing has a first chamber and a second chamber, which is hermetically sealed from the first chamber. A cooling unit is disposed in the housing and separate air flows are circulated in the first and second chambers. The air flow in the first chamber is cooled by a heat exchanger of the cooling unit. The air flow in the second chamber flows from the inlet past a second heat exchanger of the cooling unit to the outlet. In so doing, it discharges from the computer housing the heat emitted by the cooling unit.

The housing constructed in accordance with the principles of the present invention contains a cooling unit and is divided into two chambers, which are hermetically sealed from each other, in such a manner that two separate air streams are produced. The first air stream is circulated in a closed cycle along a cooling heat exchanger of the cooling unit and into the chamber of the housing, in which the electrical components of the apparatus are located. The second air stream, which is completely separated from the first, brings air from the outside into the second chamber. This outside air dissipates heat from a second heat exchanger of the cooling unit and discharges it from the housing into the surroundings.

BRIEF DESCRIPTION OF THE DRAWINGS

The invention is described in greater detail hereinafter by means of an illustrated embodiment in conjunction with the drawing. In the drawing.

DESCRIPTION OF THE PREFERRED EMBODIMENT

Figure 1:
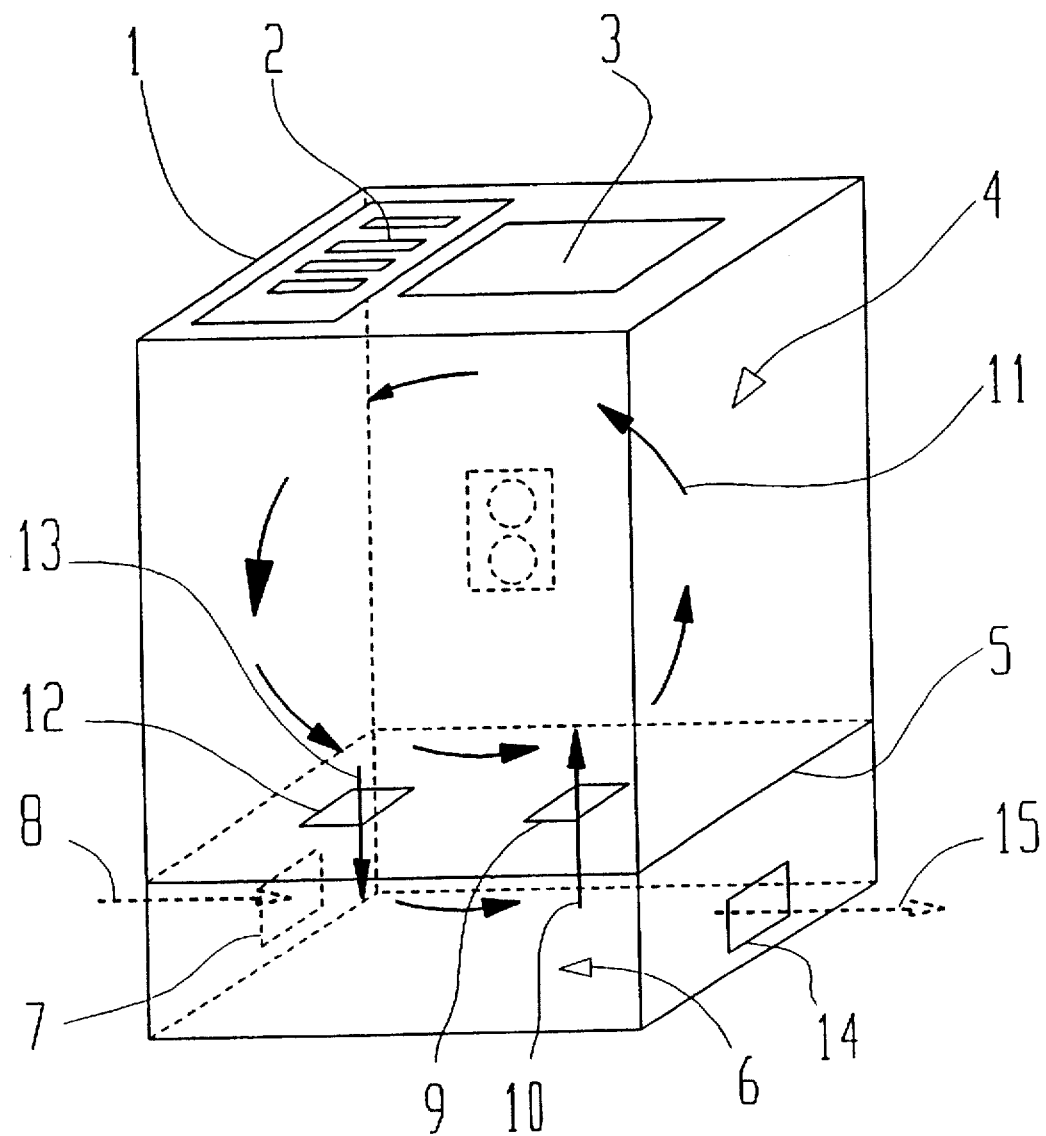
FIG. 1 shows a diagrammatic, perspective representation of an industrial housing for sensitive instruments constructed in accordance with a first embodiment of the present invention.
Figure 2:
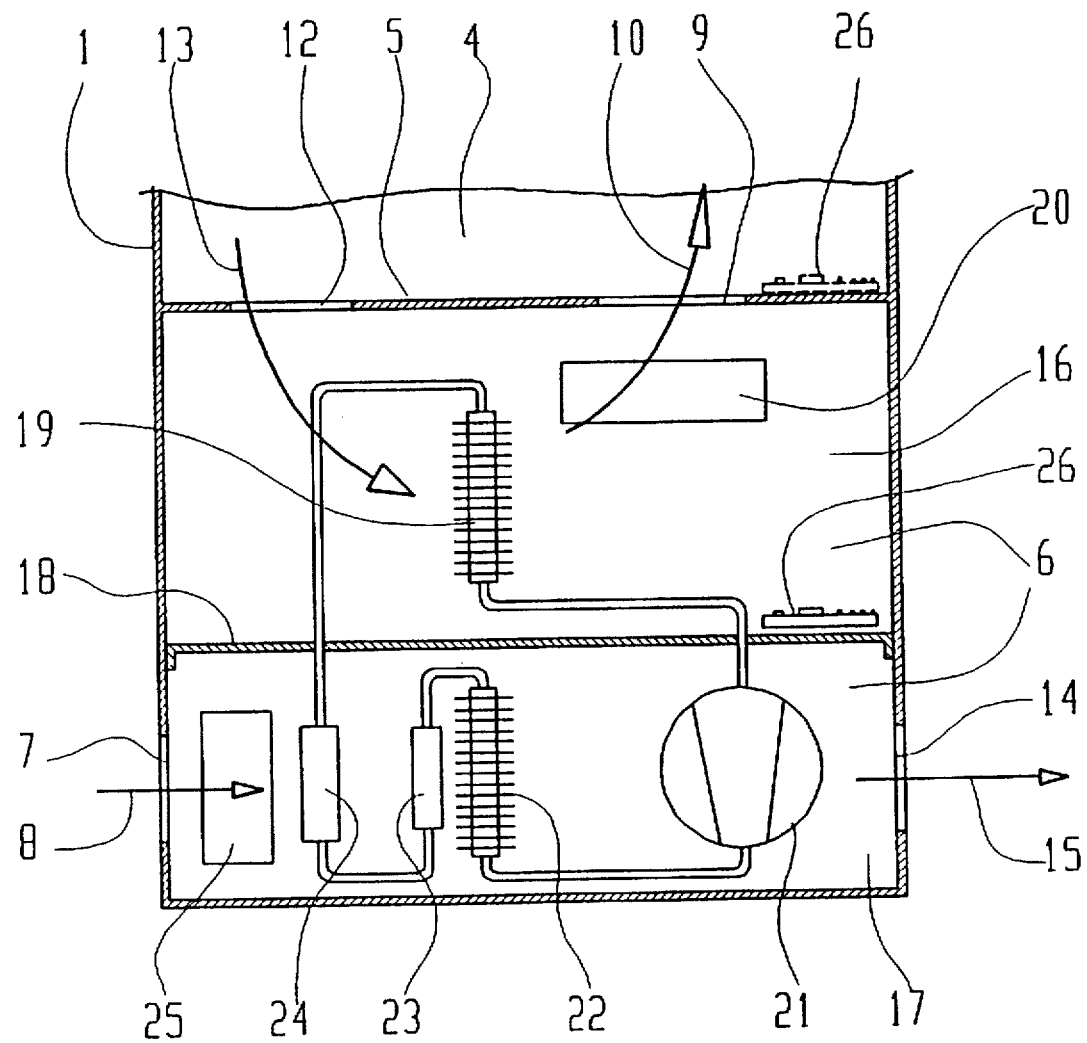
FIG. 2 shows a diagrammatic representation of a section through a portion of the embodiment of FIG. 1 taken along the lines II—II.

Referring to the drawing, a housing 1 for industrial use has a control panel 2 and a monitor 3. The interior of the housing has a first chamber 4, in which the usual components of a sensitive apparatus such as a computer are arranged, particularly a so-called mother board, a hard disk and various plug-in cards. The housing has an additional chamber 6, which is separated from the first chamber 4 by a partition 5. As can be seen in FIG. 2, chamber 6 is subdivided into a second chamber 17 and a third chamber 16. The additional chamber 6 contains a cooling unit, which is not shown in FIG. 1 in order to avoid unnecessarily complicating the drawing. This additional chamber 6 has an inlet opening 7, through which air from the surroundings can flow in the direction of arrow 8 into the additional chamber 6. This air is passed through the additional chamber 6 and flows past a heat exchanger of the cooling unit, this heat being dissipated and emitted through an opening 14 in the direction of arrow 15 to the surroundings. The interior of the first chamber 4, in which the components of the computer are arranged is in communication with the interior of the additional chamber 6 by means of openings 9 and 12. By these means, cooling air is cycled from the first chamber 4 through the opening 12 in the direction of arrow 13, through the additional chamber 6, cooled therein by a heat exchanger, not shown in FIG. 1, and returned via the opening 9 in the direction of arrow 10 back into the chamber 4. There it is circulated in the direction of the arrows 11 and passes by the individual components of the computer that are to be cooled. The cooling unit thus is an integrated component of the computer and accommodated completely in its housing.

As becomes clearer in conjunction with FIG. 2, the two circulating streams of air (arrows 10, 11 and 13) for the cooling air and the air from the environment (arrows 8 and 15) are completely separated from each other, so that the first chamber 4 contains only clean air originating from an hermetically sealed cycle. Thus, this housing can also be used in a rough industrial environment without danger that the ability of the apparatus housed therein to function will be adversely affected by air contaminants, vapors, etc.

In FIG. 2, the lower part of the housing with the additional chamber 6 for accommodating the cooling unit is shown. This additional chamber 6 is divided into two chambers, hermetically sealed with respect to an exchange of air, namely the second chamber 17 and third chamber 16. This is accomplished by an additional partition 18. The upper one of these two chambers, that is, the third chamber 16, is directly adjacent the first partition 5 and, thus the first chamber 4 containing the actual apparatus. In this upper, third chamber 16, there is a heat exchanger 19, which is part of the cooling unit with a cooling cycle. The air 13, flowing in from the first chamber 4 through the opening 12 in the first partition 5, passes by or through the heat exchanger 19 and gives up its heat, whereupon it returns as colder air through the opening 9 back into the first chamber 4. In order to keep this flow of air moving in the direction of arrows 13, 10, a fan 20 is disposed in the third chamber 16. This fan can be of any type and accordingly, is only diagrammatically illustrated. Typically, so-called crossflow fans are used because they emit less noise.

As mentioned, the heat exchanger 19 is a component of a cooling unit, which has a compressor 21, condenser 22, pressure-throttle valve 23 and a refrigerant drier 24. In this refrigeration cycle, the heat exchanger 19 also assumes the function of an evaporator. A refrigerant is circulated in this refrigeration cycle, the heat, taken up by the heat exchanger 19, vaporizes the refrigerant, such as Freon, in the heat exchanger 19. The refrigerant is brought to a higher temperature level by the compressor 21 and cooled in the condenser 22 back into liquid Freon before returning to the heat exchanger 19. The condenser 22, which is also constructed as a heat exchanger is in the stream of the outside air flowing thereby, which reaches the second chamber 17 by way of the opening 7. The heat is dissipated through the opening 14 in the direction of arrow 15. To maintain this flow of air, a second fan 25 is disposed in the second chamber 17 and preferably also constructed as a crossflow fan. It can also be recognized clearly from FIG. 2 that the two air streams, which pass by the two heat exchangers 19 and 22, are separated completely from one another by the second partition 18, so that the air from the surroundings cannot reach the first chamber 4 and the third chamber 16. It is self-evident that the inlets and outlets for the refrigerant of the heat exchanger 19, which pass through the second partition 18, are hermetically sealed with respect to this partition.

The cooling unit also has an electronic control unit 26, with which the temperature of the cool air can be controlled. This control unit 26 can be located in the first chamber 4 or in the third chamber 16 and thus is also in the "clean" part of the computer housing and is also cooled by the circulating cooling air.

It can be seen by those skilled in the art that certain modifications of the illustrated embodiment shown can be easily implemented. For example, (FIG. 3) the partition 5 in the embodiment of FIG. 1, can be omitted so that the heat exchanger 19, the fan 20 and the electronic control unit 26 of the cooling unit are accommodated in the same chamber 4 as the remaining components of the computer.

Moreover, the third chamber 16 need not be above the second chamber 17, as shown in FIG. 2; the two chambers can also be disposed side-by-side, next to each other, as long as the two streams of air are clearly separated from one another.

Figure 3:
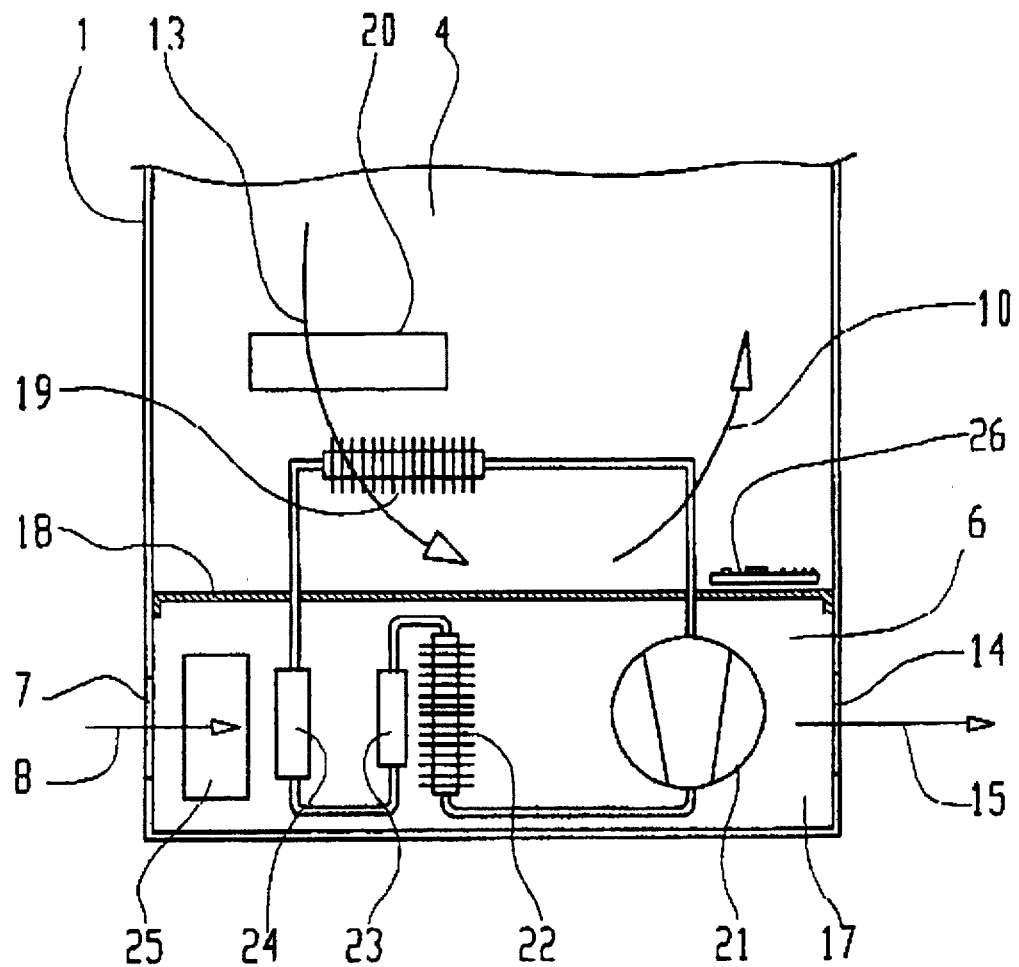
FIG. 3 is similar to FIG. 2, illustrating an alternative embodiment in accordance with the invention.

Finally, the cooling unit can also be constructed in different ways. For example, cooling water from an external water supply can be passed through the heat exchanger 19 in the third chamber 16 (FIG. 2) or in the first chamber (FIG. 3). Thereby, the vapor compression cycle may be eliminated and the blower 25 and sub-chamber 17 are unnecessary. Controls are provided to control water flow and threby the effective temperature of the heat exchanger 19 located in the closed air cycle that includes chamber 4.

To summarize, the invention enables sensitive apparatus such as computers, numerical controls or the like to be used even in rough industrial surroundings. It is also possible, if desired, to cool the interior air below the temperature of the surroundings, so that the apparatus can also be used without problems in very hot surroundings or in foundries, steel mills and the like. Because of the two separate air cycles, the apparatus can also operate satisfactorily under extreme environmental conditions such as in dust, oil or acid-containing air and/or elevated temperatures.

What is claimed is:

1. A computer housing for electronic components of a computer, said housing comprising:

a first chamber for mounting said electronic components, said first chamber being hermetically sealed from surrounding ambient air;

a second chamber adjacent said first chamber and being hermetically sealed therefrom, said second chamber having an inlet and an outlet for ambient air;

a cooling unit having a first heat exchanger mounted in said first chamber, and a second heat exchanger mounted in said second chamber;

means for circulating air within said first chamber along a first air flow path in heat exchange relationship with said first heat exchanger to cool the air within said first chamber; and means for circulating ambient air in said second chamber from said inlet to said outlet along a second separate air flow path in heat exchange relationship with said second heat exchanger to discharge the heat emitted by said cooling unit from said housing, wherein said first heat exchanger is disposed in a third chamber, which has openings through which circulated cooling air can flow to and from the first chamber, said third chamber being hermetically sealed from said second chamber.

2. A housing as claimed in claim 1, wherein said cooling unit is a vapor compresson cycle and said first heat exchanger is an evaporator and said second heat exchanger is a condenser of said cooling unit.

3. The housing of claim 1, wherein said means for circulating air along said first flow path includes a first fan and said means for circulating ambient air includes a second fan.

4. The housing of claim 3, wherein said fans are crossflow fans.

5. The housing of claim 4, wherein said cooling unit has a motor-driven compressor, a pressure throttle valve, and a refrigerant drier, said first heat exchanger being an evaporator in said cooling unit and said second heat exchanger being a condenser in said cooling unit, a refrigerant being circulated in these components.

6. The housing of claim 1, wherein means for regulating the temperature and controlling the cooling unit are disposed in said first chamber.

7. The housing of claim 1, wherein means for regulating the temperature and controlling the cooling unit are disposed in said third chamber.

8. The housing of claim 5, wherein said compressor, condenser, pressure-throttle valve and said refrigerant drier are disposed in said second chamber, and said first heat exchanger is disposed in said third chamber.

* * * * *